US010033395B1

(12) United States Patent
Vaz

(10) Patent No.: US 10,033,395 B1
(45) Date of Patent: Jul. 24, 2018

(54) SYSTEMS AND METHODS FOR ANALOG TO DIGITAL CONVERSION

(71) Applicant: Xilinx, Inc., San Jose, CA (US)

(72) Inventor: Bruno Miguel Vaz, Dundrum (IE)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 15/684,900

(22) Filed: Aug. 23, 2017

(51) Int. Cl.
*H03M 1/00* (2006.01)
*H03M 1/12* (2006.01)

(52) U.S. Cl.
CPC .......... *H03M 1/001* (2013.01); *H03M 1/002* (2013.01); *H03M 1/00* (2013.01); *H03M 1/12* (2013.01)

(58) Field of Classification Search
CPC .................................. H03M 1/00; H03M 1/12
USPC ................. 341/110, 118, 120, 155, 156, 122
See application file for complete search history.

(56) References Cited

U.S. PATENT DOCUMENTS

| | | | |
|---|---|---|---|
| 6,246,258 B1 | 6/2001 | Lesea | |
| 6,351,145 B1 | 2/2002 | Lesea | |
| 6,653,827 B2 | 11/2003 | Gaither et al. | |
| 6,784,814 B1 * | 8/2004 | Nair | H03M 1/0641 341/118 |
| 6,784,824 B1 | 8/2004 | Quinn | |
| 7,378,999 B1 | 5/2008 | McGrath et al. | |
| 8,766,832 B1 | 7/2014 | Bogue | |
| 8,970,419 B2 | 3/2015 | Farley et al. | |
| 9,048,860 B1 | 6/2015 | Quinn | |
| 9,419,624 B2 | 8/2016 | Lesea | |

OTHER PUBLICATIONS

Vaz, Bruno et al., "A 13b 4GS/s Digitally Assisted Dynamic 3-Stage Asynchronous Pipelined-SAR ADC,". Proc. of the 2017 IEEE International Solid-State Circuits Conference, Feb. 7, 2017, pp. 276-282, Session 16, No. 16.1, IEEE, Piscataway, New Jersey, USA.

Verbruggen, Bob et al., "A 2.1 mW 11b 410 MS/s Dynamic Pipelined SAR ADC with Background Calibration in 28nm Digital CMOS," Proc. of the 2013 Symposium on VLSI Circuits Digest of Technical Papers, Jun. 12, 2013, pp. 268-269, IEEE, Piscataway, New Jersey, USA.

* cited by examiner

*Primary Examiner* — Joseph Lauture
(74) *Attorney, Agent, or Firm* — David O'Brien

(57) ABSTRACT

An analog to digital converter (ADC) circuit includes a first stage for converting a first analog voltage signal to a first digital signal including a first portion of a digital output signal representing the first analog voltage signal, and generate a first residue voltage based on the first analog voltage signal and the first digital signal. A first amplifier control unit generates a first amplifier start signal based on a second stage ready signal indicating that a second stage is ready to process a second analog voltage signal. In response to the second stage ready signal, a first amplifier generates the second analog voltage signal based on the first residue voltage. The second stage is configured to generate the second stage ready signal, receive the second analog voltage signal, and convert the second analog voltage signal to a second digital signal including a second portion of the digital output signal.

20 Claims, 10 Drawing Sheets

SYSTEMS AND METHODS FOR ANALOG TO DIGITAL CONVERSION

TECHNICAL FIELD

Examples of the present disclosure generally relate to integrated circuits (ICs) and, in particular, to embodiments related to an analog to digital converter (ADC).

BACKGROUND

An analog-to-digital converter (ADC) converts an input analog signal to an output digital signal that is an approximation of the input analog signal. The resolution of an ADC defines the accuracy of the approximation between the output digital signal and the input analog signal. In this regard, the closer the resemblance between the output digital signal and the input analog signal, the greater the resolution of the ADC. One of the ADC architectures is a pipeline ADC. Pipeline ADCs generally find application in systems operating at speeds of 10-200 MHz and requiring moderate resolution of the order of 10-14 bits. A major drawback with pipeline ADCs may involve latency occurring at various processing stages. Further, pipeline ADCs may be extremely sensitive to non-linearities affecting offset and gain. pipeline ADC based designs may require complex reference circuitry and precise latch timing in order to ensure output synchronization.

Accordingly, it would be desirable and useful to provide an improved way of providing pipeline ADCs.

SUMMARY

In some embodiments in accordance with the present disclosure, an analog to digital converter (ADC) circuit includes a first stage, a first amplifier control unit, a first amplifier, and a second stage. The first stage is configured to receive a first analog voltage signal; convert the first analog voltage signal to a first digital signal including a first portion of a digital output signal representing the first analog voltage signal; generate a first residue voltage signal based on the first analog voltage signal and the first digital signal. The first amplifier control unit is configured to generate a first amplifier start signal based on a second stage ready signal indicating that a second stage is ready to process a second analog voltage signal. The first amplifier configured to in response to the first amplifier start signal, generate the second analog voltage signal based on the first residue voltage signal. The second stage is configured to generate the second stage ready signal; receive, from the first amplifier, the second analog voltage signal; and convert the second analog voltage signal to a second digital signal including a second portion of the digital output signal.

In some embodiments, the first stage includes a first ADC element configured to convert the first analog voltage signal to the first digital signal; a first digital-to-analog converter (DAC) configured to convert the first digital signal to a reconverted analog voltage signal; and a residue voltage circuit configured to generate the first residue voltage signal corresponding to a difference between the first analog voltage signal and the reconverted analog voltage signal. The first amplifier control unit is configured to generate the first amplifier start signal based on a first stage end signal indicating that the first stage completes processing the first analog voltage signal.

In some embodiments, the ADC circuit includes a timing controller configured to receive a reference clock signal; receive, from the first stage, a first stage ready signal indicating that the first stage is ready to process the first analog voltage signal; and generate a sampling clock signal based on the first stage ready signal and the reference clock signal; and a sampling circuit configured to generate the first analog voltage signal by sampling an analog input signal based on the sampling clock signal.

In some embodiments, the timing controller is configured to generate a first stage start signal based on the sampling clock signal. The first stage is configured to receive the first stage start signal; and in response to the first stage start signal, start to convert the first analog voltage signal to the first digital signal.

In some embodiments, the timing controller is configured to generate the sampling clock signal based on a first sampling frequency; and generate a sampling frequency status flag indicating that the first sampling frequency exceeds a predefined maximum sampling frequency.

In some embodiments, the timing controller is configured to generate a missed sample flag indicating that the ADC circuit misses a first sample of the analog input signal based on the sampling clock signal and the first stage ready signal.

In some embodiments, the first amplifier is configured to provide a first amplifier end signal indicating that the first amplifier completes generating the second analog voltage signal. The first stage is configured to reset a plurality of components of the first stage in response to the first amplifier end signal. The second stage is configured to start to convert the second analog voltage signal to the second digital signal in response to the first amplifier end signal.

In some embodiments, the second stage is configured to generate a second stage end signal indicating that the second stage completes processing the second analog voltage signal; and in response to the second stage end signal, reset a plurality of components of the second stage.

In some embodiments, the ADC circuit includes a second amplifier and a third stage. The second amplifier is configured to receive, from the second stage, a second residue voltage signal based on the second analog voltage signal and the second digital signal; receive, from the third stage, a third stage ready signal indicating that the second stage is ready to process a third analog voltage signal; and in response to the third stage ready signal, generate the third analog voltage signal based on the second residue voltage signal. The third stage is configured to generate the third stage ready signal; receive, from the second amplifier, the third analog voltage signal; and convert the third analog voltage signal to a third digital signal including a third portion of the digital output signal.

In some embodiments, the first amplifier is an open loop integrating amplifier.

In some embodiments in accordance with the present disclosure, a method includes receiving, by a first stage, a first analog voltage signal; converting, by the first stage, the first analog voltage signal to a first digital signal including a first portion of a digital output signal representing the first analog voltage signal; generating, by the first stage, a first residue voltage signal based on the first analog voltage signal and the first digital signal; generating, by a second stage, a second stage ready signal indicating that the second stage is ready to process a second analog voltage signal; generating, by a first amplifier control unit, a first amplifier start signal based on the second stage ready signal; generating, by the first amplifier, the second analog voltage signal based on the first residue voltage signal in response to the first amplifier start signal; and converting, by the second stage, the second analog voltage signal to a second digital signal including a second portion of the digital output signal.

In some embodiments, the generating the first residue voltage signal includes converting the first digital signal to a reconverted analog voltage signal; and generating the first residue voltage signal corresponding to a difference between the first analog voltage signal and the reconverted analog voltage signal. The generating the first amplifier start signal includes generating, by the first amplifier control unit, the first amplifier start signal based on a first stage end signal indicating that the first stage completes processing the first analog voltage signal.

In some embodiments, the method includes receiving a reference clock signal; receiving, from the first stage, a first stage ready signal indicating that the first stage is ready to process the first analog voltage signal; generating a sampling clock signal based on the first stage ready signal and the reference clock signal; and generating the first analog voltage signal by sampling an analog input signal based on the sampling clock signal.

In some embodiments, the method includes generating a first stage start signal based on the sampling clock signal; receiving, by the first stage, the first stage start signal; and in response to the first stage start signal, starting, by the first stage, to convert the first analog voltage signal to the first digital signal.

In some embodiments, the method includes generating the sampling clock signal based on a first sampling frequency; generating a sampling frequency status flag indicating that the first sampling frequency exceeds a predefined maximum sampling frequency.

In some embodiments, the method includes generating a missed sample flag indicating that the first analog voltage signal misses a first sample associated with the analog input signal based on the sampling clock signal and the first stage ready signal.

In some embodiments, the method includes providing, by the first amplifier, a first amplifier end signal indicating that the first amplifier completes generating the second analog voltage signal; in response to the first amplifier end signal, resetting, by the first stage, a plurality of components of the first stage; and in response to the first amplifier end signal, starting, by the second stage to convert the second analog voltage signal to the second digital signal.

In some embodiments, the method includes generating, by the second stage, a second stage end signal indicating that the second stage completes processing the second analog voltage signal; and in response to the second stage end signal, reset, by the second stage, a plurality of components of the second stage.

In some embodiments, the method includes receiving, by a second amplifier from the second stage, a second residue voltage signal based on the second analog voltage signal and the second digital signal; generating, by a third stage, a third stage ready signal; receiving, by the second amplifier from the third stage, the third stage ready signal indicating that the second stage is ready to process a third analog voltage signal; in response to the third stage ready signal, generating, by the second amplifier, the third analog voltage signal based on the second residue voltage signal; and converting, by the third stage, the third analog voltage signal to a third digital signal including a third portion of the digital output signal.

In some embodiments, the method includes receiving, from the first stage, a first stage end signal indicating that the first stage completes processing the first analog voltage signal; and generating the first amplifier start signal based on the second stage ready signal and the first stage end signal.

Other aspects and features will be evident from reading the following detailed description and accompanying drawings.

DETAILED DESCRIPTION

Figure 1:
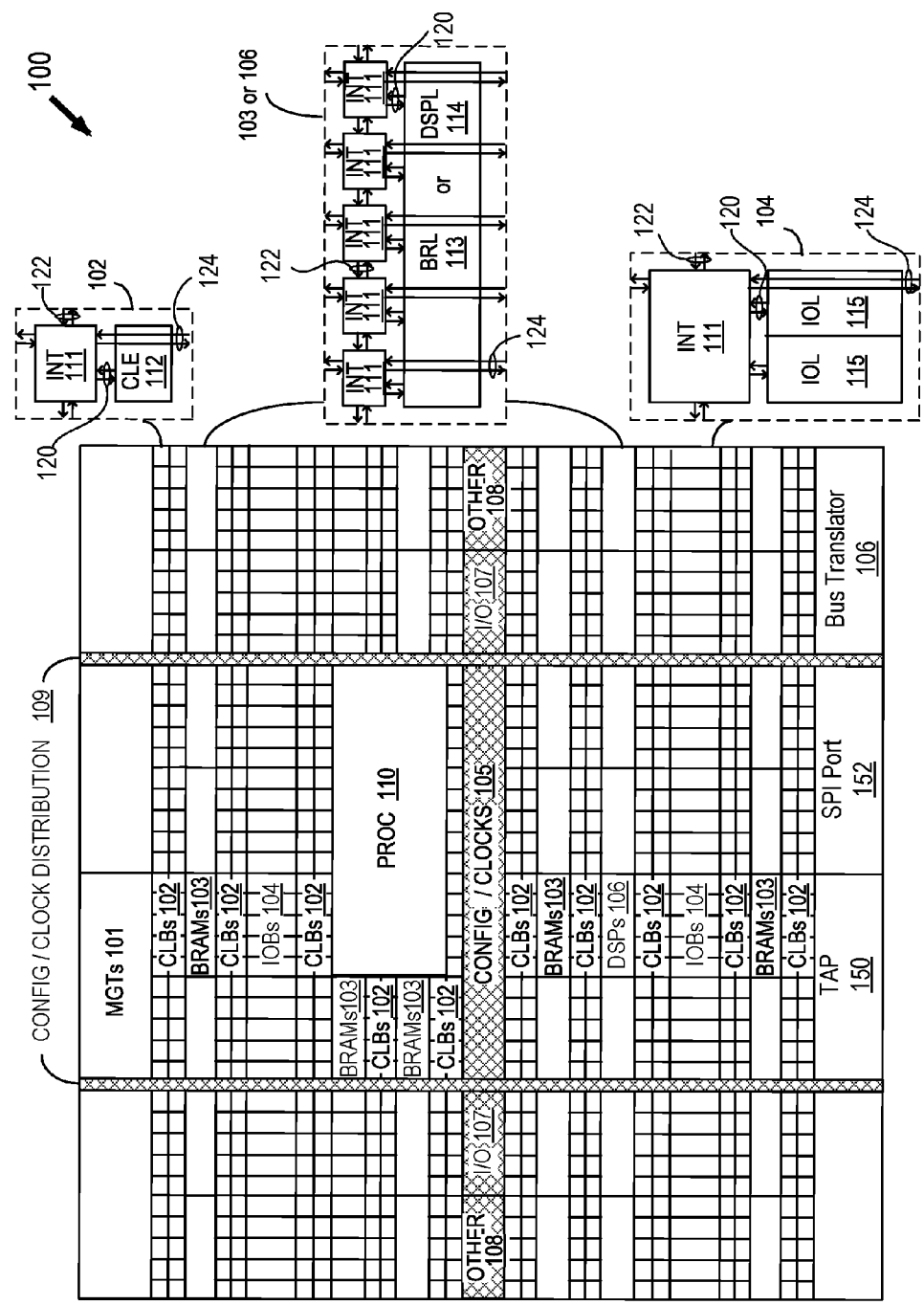
FIG. 1 is a block diagram illustrating an exemplary architecture for an IC according to some embodiments of the present disclosure.

Various embodiments are described hereinafter with reference to the figures, in which exemplary embodiments are shown. The claimed invention may, however, be embodied in different forms and should not be construed as being limited to the embodiments set forth herein. Like reference numerals refer to like elements throughout. Like elements will, thus, not be described in detail with respect to the description of each figure. It should also be noted that the figures are only intended to facilitate the description of the embodiments. They are not intended as an exhaustive description of the claimed invention or as a limitation on the scope of the claimed invention. In addition, an illustrated embodiment needs not have all the aspects or advantages shown. An aspect or an advantage described in conjunction with a particular embodiment is not necessarily limited to that embodiment and can be practiced in any other embodiments even if not so illustrated, or if not so explicitly described. The features, functions, and advantages may be achieved independently in various embodiments or may be combined in yet other embodiments.

Before describing exemplary embodiments illustratively depicted in the several figures, a general introduction is provided to further understanding. In some embodiments where leakage is not an issue and settling time is very predictable, closed loop implementations of multi-stage ADCs may use a synchronous clocking scheme. In such implementations, a non-overlapping clock generator may generate a clock signal with pulse width inversely proportional to the sampling frequency. Such a synchronous clocking scheme may reduce the biasing current for lower sampling frequencies. When sampling frequencies are very high, ADCs with closed loop implementations have performance limitations due to fundamental gain-bandwidth (GBW) limitations of deep submicron complementary metal oxide semiconductor (CMOS) technologies.

To overcome such limitations and to reduce power dissipation, a two-stage ADC including open loop stages and a single integrating amplifier may be used. However, such open stages are susceptible to leakage. Further, due to the limited gain of that single integrating amplifier, the comparators noise of a fine stage of the two stages of the two-stage ADC is substantial, which requires multiple comparators with significantly different specifications. Moreover, in such implementations, because there are only two stages in the ADC, each stage has to quantize a large number of digital bits, which limits the maximum sampling frequency of the ADC. Also, because the amplification time of integrating amplifiers varies considerably across process, voltage, and temperature (PVT) and the leakage, the achievable ADC performance may be limited at low sampling frequencies if a synchronous clocking scheme is used.

For integrated circuit (IC) solutions, it has been discovered that by using a modular handshaking scheme implemented with an asynchronous clocking scheme, a multi-stage pipeline ADC may be implemented using open loop integrating amplifiers. Such a modular handshaking scheme may maximize the sampling frequency, resolution, and linearity of the ADC. In various embodiments, the ADC may be implemented using dynamic circuits and multiple calibration loops to reduce cost, power, and noise, maximize process portability, and support production testability.

Various advantages may be present in various applications of the present disclosure. No particular advantage is required for all embodiments, and different embodiments may offer different advantages. One of the advantages of some embodiments is that by using an asynchronous clocking scheme, performance across a broad sampling frequency range may be maintained. Another advantage of some embodiments is that by using a modular handshaking scheme, it is guaranteed that an integrating amplifier waits for the next stage to be ready before starting integration. Yet another advantage is that such a modular handshaking scheme may enable cascading multiple stages and amplifiers. As such, the noise/offset requirements of back-end comparators are reduced. This may allow aggressive optimization of comparator decision time and the use of a single comparator design across the pipeline of the ADC. Yet another advantage is that the modular handshaking scheme may allow more than two stages in a pipeline ADC, and reduce the number of digital bits quantized by each stage, which may maximize the achievable sampling frequency of the ADC. Yet another advantage is that a timing controller may be used to control the pipeline ADC. Such a timing controller may generate status flags (e.g. sampling frequency flags, missed sample flags) when the pipeline ADC is not operating under normal conditions.

With the above general understanding borne in mind, various embodiments for asynchronous control of a multi-stage pipeline ADC are generally described below. Because one or more of the above-described embodiments are exemplified using a particular type of IC, a detailed description of such an IC is provided below. However, it should be understood that other types of ICs may benefit from one or more of the embodiments described herein.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device (CPLD). A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

In general, each of these programmable logic devices ("PLDs"), the functionality of the device is controlled by configuration data provided to the device for that purpose. The configuration data can be stored in volatile memory (e.g., static memory cells, as common in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

As noted above, advanced FPGAs can include several different types of programmable logic blocks in the array. For example, FIG. 1 illustrates an exemplary FPGA architecture 100. The FPGA architecture 100 includes a large number of different programmable tiles, including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile can include at least one programmable interconnect element ("INT") 111 having connections to input and output terminals 120 of a programmable logic element within the same tile, as shown by examples included at the top of FIG. 1. Each programmable interconnect element 111 can also include connections to interconnect segments 122 of adjacent programmable interconnect element(s) in the same tile or other tile(s). Each programmable interconnect element 111 can also include connections to interconnect segments 124 of general routing resources between logic blocks (not shown). The general routing resources can include routing channels between logic blocks (not shown) comprising tracks of interconnect segments (e.g., interconnect segments 124) and switch blocks (not shown) for connecting interconnect segments. The interconnect segments of the general routing resources (e.g., interconnect segments 124) can span one or more logic blocks. The programmable interconnect elements 111 taken together with the general routing resources implement a programmable interconnect structure ("programmable interconnect") for the illustrated FPGA.

In an example implementation, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 106 can include a DSP logic element ("DSPL") 114 in addition to an appropriate number of programmable interconnect elements. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the example of FIG. 1, an area (depicted horizontally) near the center of the die (e.g., formed of regions 105, 107, and 108 shown in FIG. 1) can be used for configuration, clock, and other control logic. Column 109 (depicted vertically) extending from this horizontal area or other columns may be used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, PROC 110 spans several columns of CLBs and BRAMs. PROC 110 can include various components ranging from a single microprocessor to a complete programmable processing system of microprocessor(s), memory controllers, peripherals, and the like.

In one aspect, PROC 110 is implemented as a dedicated circuitry, e.g., as a hard-wired processor, that is fabricated as part of the die that implements the programmable circuitry of the IC. PROC 110 can represent any of a variety of different processor types and/or systems ranging in complexity from an individual processor, e.g., a single core capable of executing program code, to an entire processor system having one or more cores, modules, co-processors, interfaces, or the like.

In another aspect, PROC 110 is omitted from architecture 100, and may be replaced with one or more of the other varieties of the programmable blocks described. Further, such blocks can be utilized to form a "soft processor" in that the various blocks of programmable circuitry can be used to form a processor that can execute program code, as is the case with PROC 110.

The phrase "programmable circuitry" can refer to programmable circuit elements within an IC, e.g., the various programmable or configurable circuit blocks or tiles described herein, as well as the interconnect circuitry that selectively couples the various circuit blocks, tiles, and/or elements according to configuration data that is loaded into the IC. For example, portions shown in FIG. 1 that are external to PROC 110 such as CLBs 102 and BRAMs 103 can be considered programmable circuitry of the IC.

In some embodiments, the functionality and connectivity of programmable circuitry are not established until configuration data is loaded into the IC. A set of configuration data can be used to program programmable circuitry of an IC such as an FPGA. The configuration data is, in some cases, referred to as a "configuration bitstream." In general, programmable circuitry is not operational or functional without first loading a configuration bitstream into the IC. The configuration bitstream effectively implements or instantiates a particular circuit design within the programmable circuitry. The circuit design specifies, for example, functional aspects of the programmable circuit blocks and physical connectivity among the various programmable circuit blocks.

In some embodiments, circuitry that is "hardwired" or "hardened," i.e., not programmable, is manufactured as part of the IC. Unlike programmable circuitry, hardwired circuitry or circuit blocks are not implemented after the manufacture of the IC through the loading of a configuration bitstream. Hardwired circuitry is generally considered to have dedicated circuit blocks and interconnects, for example, that are functional without first loading a configuration bitstream into the IC, e.g., PROC 110.

In some instances, hardwired circuitry can have one or more operational modes that can be set or selected according to register settings or values stored in one or more memory elements within the IC. The operational modes can be set, for example, through the loading of a configuration bitstream into the IC. Despite this ability, hardwired circuitry is not considered programmable circuitry as the hardwired circuitry is operable and has a particular function when manufactured as part of the IC.

FIG. 1 is intended to illustrate an exemplary architecture that can be used to implement an IC that includes programmable circuitry, e.g., a programmable fabric. For example, the numbers of logic blocks in a row, the relative width of the rows, the number and order of rows, the types of logic blocks included in the rows, the relative sizes of the logic blocks, and the interconnect/logic implementations included at the top of FIG. 1 are purely exemplary. For example, in an actual IC, more than one adjacent row of CLBs is typically included wherever the CLBs appear, to facilitate the efficient implementation of user logic, but the number of adjacent CLB rows varies with the overall size of the IC.

Moreover, the FPGA of FIG. 1 illustrates one example of a programmable IC that can employ examples of the interconnect circuits described herein. The interconnect circuits described herein can be used in other types of programmable ICs, such as CPLDs or any type of programmable IC having a programmable interconnect structure for selectively coupling logic elements.

It is noted that the IC that may implement the ADC system is not limited to the exemplary IC depicted in FIG. 1, and that IC having other configurations, or other types of IC, may also implement the ADC system.

Figure 2:
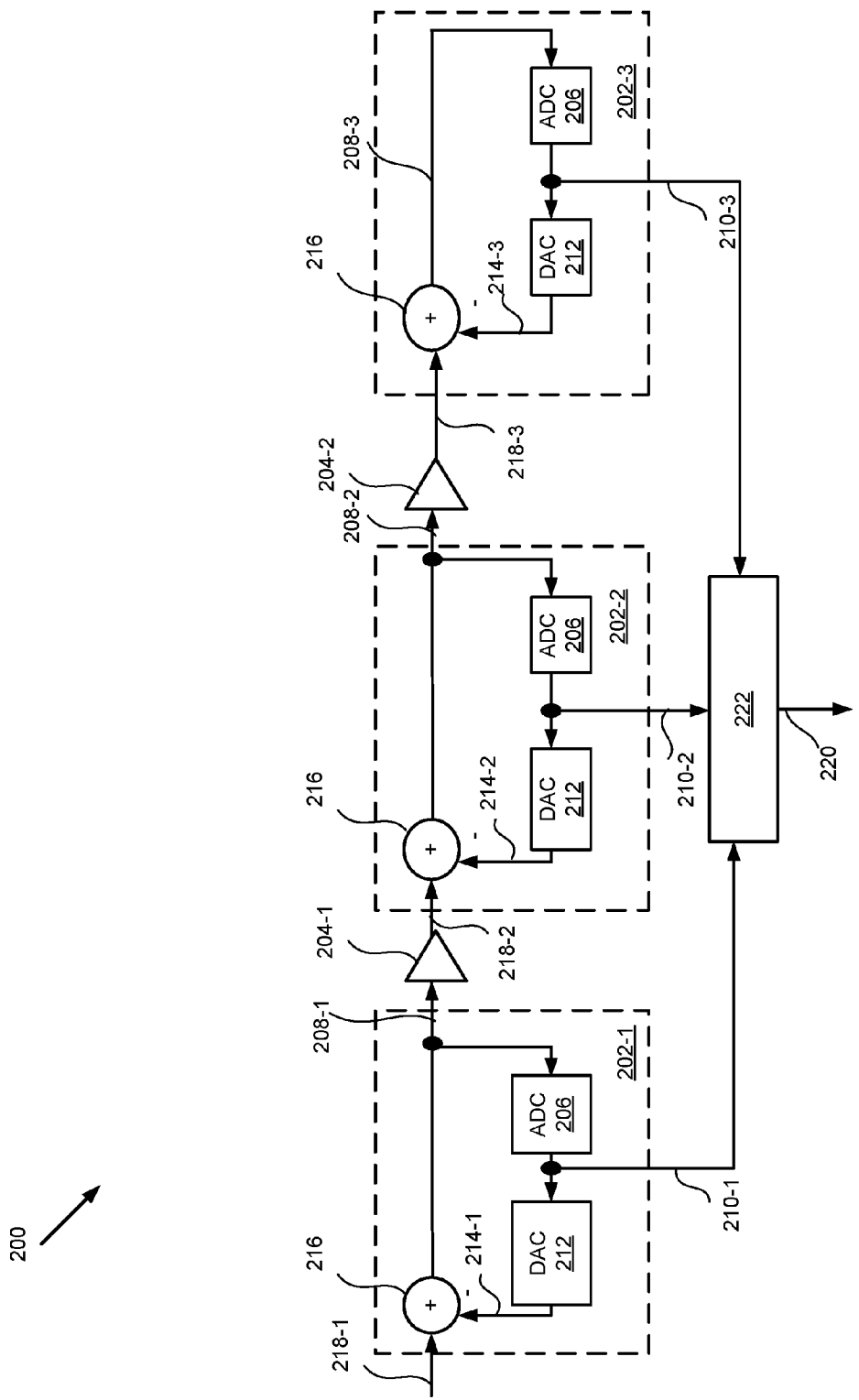
FIG. 2 is a block diagram illustrating an exemplary pipeline ADC according to some embodiments of the present disclosure.

Referring to FIG. 2, illustrated is a pipeline ADC 200 including a plurality of stages to convert an analog voltage to a digital output signal. The exemplary ADC 200 of FIG. 2 includes three stages 202-1, 202-2, and 202-3 separated by two amplifiers 204-1 and 204-2. Each of the stages 202-1, 202-2, and 202-3 may compare an analog voltage to one or more reference voltages to generate one or more digital bits of the digital output signal. Succeeding stages may generate a digital signal including lower significant digit bits than preceding stages in the pipeline of the ADC 200. The $i^{th}$ stage 202-$i$ includes an ADC element 206 that converts an analog voltage signal 208-$i$ to a digital signal 210-$i$ including one or more digital bits. In some embodiments, the ADC element 206 includes sampling capacitors coupled to a successive approximation register (SAR) logic for generating the digital signal 210-$i$. Such an ADC element 206 may also be referred to as an SAR ADC element 206.

In some embodiments, the digital signal 210-$i$ may also be sent to a DAC element 212, which converts the digital signal 210-$i$ to a reconverted analog voltage 214-$i$. The DAC element 212 may include a split-capacitor multiplying DAC to improve speed. The reconverted analog voltage 214-$i$ is then sent to a residue voltage generator 216 (e.g., a subtractor), which may generate a residue voltage signal 208-$i$ by subtracting the reconverted analog voltage 214-$i$ from the analog voltage 218-$i$.

In some embodiments, the residue voltage signal 208-$i$ is amplified by an amplifier 204-$i$ coupled to the stage 202-$i$ to generate an analog voltage signal 218-$(i+1)$ for the next stage. In some embodiments, the amplifier 204-$i$ may include an integrating amplifier, and its gain may be adjusted by sizing its load capacitances. The analog voltage signal 218-$(i+1)$ may be sent to the next stage 202-$(i+1)$ coupled to the amplifier 204-$i$, which may generate one or more output digital bits based on the analog voltage signal 218-$i$.

In the example of FIG. 2, the stages 202-1, 202-2, and 202-3 generate digital signals 210-1, 210-2, and 210-3 respectively. In a particular example, each stage generates five digital bits of the digital output signal 220 representing the analog voltage signal 218-1. In that particular example, digital signals 210-1, 210-2, and 210-3 may include the five most significant bits (B<14:10>), the five lower significant bits (B<9:5>), and the five lowest significant bits (B<4:0>) of the digital output signal 220 respectively. The digital signals 210-1, 210-2, and 210-3 are sent to a combiner 222, which generates a digital output signal 220 (e.g., B<14:0>) by combining all the digital signals 210-1, 210-2, and 210-3 (e.g., B<14:10>, B<9:5>, and B<4:0>).

Referring to FIGS. 3 through 10, by implementing an asynchronous clocking scheme, a modular handshaking scheme may be used to implement a multi-stage pipeline ADC. Such a modular handshaking scheme guarantees that an integrating amplifier of the ADC waits for the next stage to be ready before starting integration. It enables cascading multiple stages and amplifiers, which allows aggressive optimization of comparator decision time and the use of a single comparator design across the pipeline chain. Furthermore, it enables reducing the number of digital bits quantized by each stage to maximize the achievable sampling frequency. Also, in some embodiments, a timing controller may be used to control the pipeline ADC. Such a timing controller may generate status flags (e.g. sampling frequency flags, missed sample flags) indicating that the pipeline ADC is not operating under normal conditions.

Figure 3:
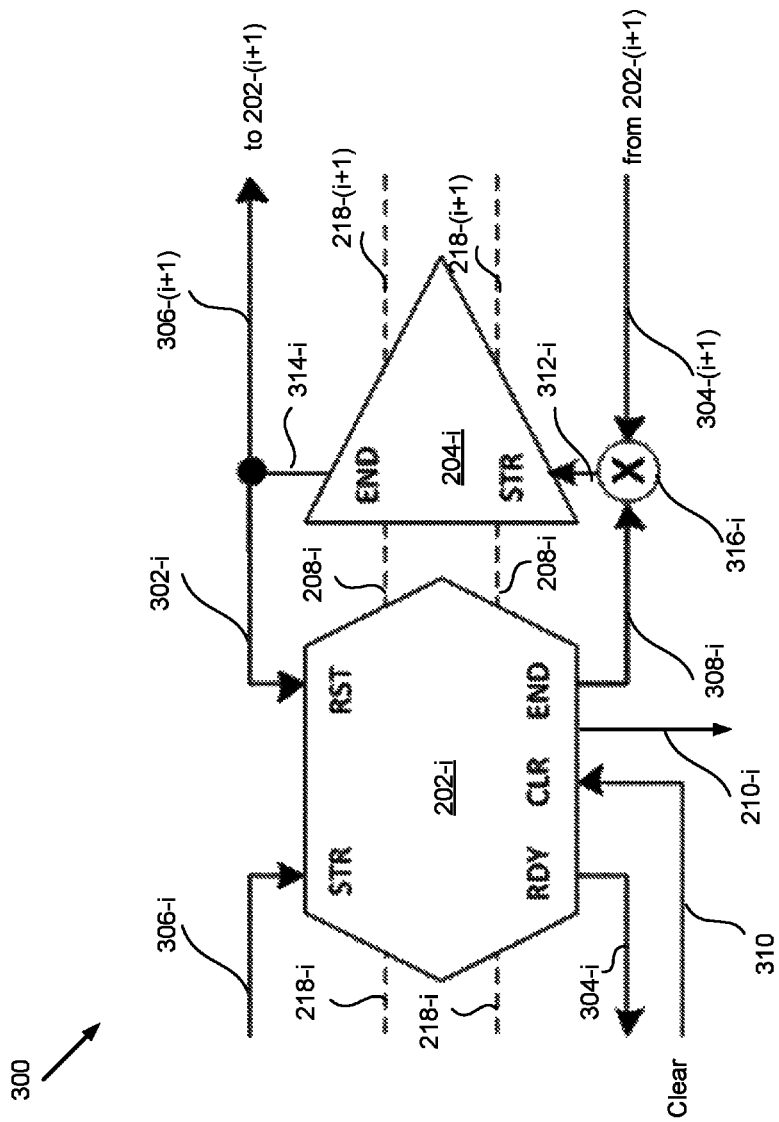
FIG. 3 is a block diagram illustrating an exemplary block of a pipeline ADC according to some embodiments of the present disclosure.

Referring to FIG. 3, illustrated is a block 300 of a multi-stage pipeline ADC 200 implementing a modular handshaking scheme using an asynchronous clock scheme. In the example of FIG. 3, the block 300 is the $i^{th}$ block of the multi-stage pipeline ADC 200 of FIG. 2, and includes the $i^{th}$ stage 202-$i$ followed by an amplifier 204-$i$. The stage 202-$i$ receives an analog voltage 218-$i$, and generates a plurality of digital bits in a digital signal 210-$i$ corresponding to the analog voltage 218-$i$. The stage 202-$i$ further sends a residue analog voltage 208-$i$ to the amplifier 204-$i$. The amplifier 204-$i$ may perform amplification to the residue analog voltage 208-$i$ and generate an analog voltage 218-$(i+1)$ that is sent to the next stage 202-$(i+1)$.

In various embodiments, the block 300 uses various signals for controlling the operations of the stage 202-$i$ and the amplifier 204-$i$. These signals may include for example, a stage reset signal 302-$i$, a stage ready signal 304-$i$, a stage start signal 306-$i$, a stage end signal 308-$i$, a clear signal 310, an amplifier start signal 312-$i$, and an amplifier end signal 314-$i$. For example, the stage reset signal 302-$i$ is sent to a reset terminal of the stage 202-$i$ for resetting components (e.g., sampling capacitors) of the stage 202-$i$. After the reset process is completed (e.g., after the sampling capacitors of the stage 202-$i$ have been fully discharged), the stage 202-$i$ outputs a stage ready signal 304-$i$ providing an indication that the stage 202-$i$ is ready to process the next sample in the analog voltage signal 218-$i$. The stage ready signal 304-$i$ may be used to control the operation of the preceding amplifier 204-$(i-1)$, so that the preceding amplifier 204-$(i-1)$ begins integration after the capacitors of the stage 202-$i$ have been fully discharged.

As shown in the example of FIG. 3, a stage start signal 306-$i$ is sent to a start terminal of the stage 202-$i$, which may trigger the operations of the stage 202-$i$ for processing a particular sample. The operations of the stage 202-$i$ may include an analog to digital conversion performed by an ADC element 206 of the stage 202-$i$, a digital to analog conversion performed by a DAC element 212 of the stage 202-$i$, and a subtraction performed by a residue voltage generator 216 for generating the residue voltage signal 208-$i$. In some embodiments, after generating the residue voltage signal 208-1, the stage 202-$i$ provides a stage end signal 308-$i$ indicating that the stage 202-$i$ has completed the operations for that particular sample.

In some embodiments, operations of the amplifier 204-$i$ may be controlled by signals from both the stage 202-$i$ preceding the amplifier 204-$i$ and the stage 202-$(i+1)$ following the amplifier 204-$i$. For example, a stage end signal 308-$i$ from the preceding stage 202-$i$ and a stage ready signal 304-$(i+1)$ from the following stage 202-$(i+1)$ are combined using an amplifier control unit 316-$i$ (e.g., a multiplier) to generate an amplifier start signal 312-$i$. The amplifier start signal 312-$i$ is sent to a start terminal of the amplifier 204-$i$. The amplifier start signal 312-$i$ may trigger the amplifier 204-$i$ to begin integration, and amplify the analog voltage 208-$i$ to generate analog voltage signal 218-$(i+1)$. After the amplifier 204-$i$ completes the amplification process to generate the analog voltage 218-$(i+1)$, the amplifier 204-$i$ outputs an amplifier end signal 314-*i* indicating that the amplification process has completed.

In some embodiments, a stage reset signal 302-*i* based on the amplifier end signal 314-*i* is sent to a reset terminal of the stage 202-*i* preceding the amplifier 204-*i*, which may trigger a reset process of the stage 202-*i*. After the stage 202-*i* completes the reset process, it may output a stage ready signal 304-*i* indicating that the stage 202-*i* is ready to process the next sample.

In some embodiments, a stage start signal 306-(*i*+1) based on the amplifier end signal 314-*i* is sent to a start terminal of a stage 202-(*i*+1) following the amplifier 204-*i*. The stage start signal 306-(*i*+1) may trigger the operations of the stage 202-(*i*+1) for processing the analog voltage signal 218-(*i*+1) to generate the next set of digital bits in a digital signal 210-(*i*+1).

Figure 4:
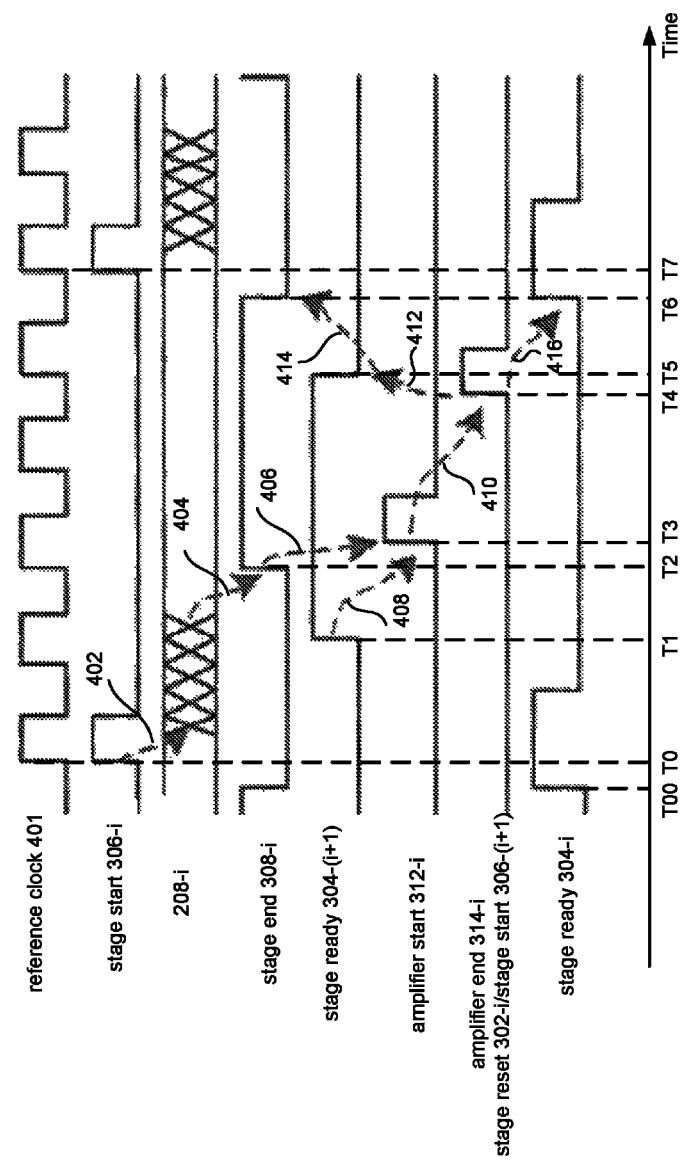
FIG. 4 illustrates waveforms illustrating the clocking of the block of the FIG. 3 according to some embodiments of the present disclosure.

Referring to FIG. 4, illustrated are waveforms of the block 300 and a reference clock signal 401. As shown in FIG. 4, at time T00, the stage 202-*i* provides a stage ready signal 304-*i* indicating that the stage 202-*i* is ready for processing the next sample. At time T0, a stage start signal 306-*i* is set to high at a rising edge of a reference clock signal 401. As illustrated by the arrow 402, in response to the stage start signal 306-*i*, the stage 202-*i* begins to perform an analog to digital conversion (e.g., by using an ADC element 206) to convert a first sample in the analog voltage signal 218-*i* to digital bits in the digital signal 210-*i*. After the stage 202-*i* completes the analog to digital conversion by using the ADC element 206, it generates the residue voltage signal 208-*i* and sends the residue voltage signal 208-*i* to the amplifier 204-*i*. As illustrated by the arrow 404, at time T2, the stage end signal 308-*i* is set to high after the generation of the residue voltage signal 208-*i* is completed.

In some embodiments, the amplifier 204-*i* may receive an amplifier start signal 312-*i* determined based on a stage end signal 308-*i* from a preceding stage 202-*i* and a stage ready signal 304-(*i*+1) from a succeeding stage 202-(*i*+1). In the example of FIG. 4, the stage ready signal 304-(*i*+1) is set to high at time T1, indicating that the next stage 202-(*i*+1) in the pipeline ADC 200 is ready to process the next sample. As shown by arrows 406 and 408, at time T3, the amplifier start signal 312-*i* is set to high based on the stage end signal 308-*i* and the stage ready signal 304-(*i*+1), which were set to high at times T2 and T1 respectively prior to time T3.

In response to the amplifier start signal 312-*i*, at T3, the amplifier 204-*i* may begin integration, and generate an analog voltage 218-(*i*+1) by amplifying the residue analog voltage 208-*i*. The analog voltage 218-(*i*+1) is sent to the next stage 202-(*i*+1) for generating the next set of digital bits. As indicated by the arrow 410, at time T4, an amplifier end signal 314-*i* is set to high, indicating that the amplifier 204-*i* completes the amplification process.

In some embodiments, the amplifier end signal 314-*i* is sent to a start terminal of the succeeding stage 202-(*i*+1), which may trigger the operations of the stage 202-(*i*+1). The amplifier end signal 314-*i* signal sent to the start terminal of the stage 202-(*i*+1) may also be referred to as the stage start signal 306-(*i*+1). As indicated by the arrow 412, after the stage 202-(*i*+1) begins the analog to digital conversion, at time T5, the stage ready signal 304-(*i*+1) is pulled low.

In some embodiments, the amplifier end signal 314-*i* is sent to a reset terminal of the stage 202-*i*, which triggers a reset process of the stage 202-*i*. The amplifier end signal 314-*i* signal sent to the reset terminal is also be referred to as the stage reset signal 302-*i*. In some embodiments, in response to the stage reset signal 302-*i*, the stage 202-*i* may perform a reset process. During the reset process, capacitors of the stage 202-*i* (e.g., sampling/load capacitors) may be discharged. After the capacitors of the stage 202-*i* are fully discharged, the stage 202-*i* may determine that it is ready to process the next sample, and the stage ready signal 304-*i* is set to high at time T6 as illustrated by the arrow 416. Furthermore, as illustrated by the arrows 412 and 414, at time T6, the stage end signal 308-*i* is pulled low when the stage 202-*i* becomes ready for the next sample.

As shown in FIG. 4, at time T7, at a rising edge of the reference clock signal 401 after time T5, the stage start signal 306-*i* is set to high. In response, the block 300 may begin operations for the next sample.

As shown in the examples of FIGS. 3 and 4, the timing of the processes performed at the block 300 of the pipeline ADC is asynchronous. Those processes may include the analog to digital conversion process by the ADC element 206, the digital to analog conversion process by the DAC element 212, the subtraction process by the residue voltage generator 216, and the amplification process by the amplifier 204-*i*. Note that in some embodiments, the amplifier 204-*i* begins integration after receiving both the stage end signal 308-*i* from the stage 202-*i* preceding the amplifier 204-*i* and the stage ready signal 304-(*i*+1) from the stage 202-(*i*+1) following the amplifier 204-*i*. As such, in those embodiments, it is guaranteed that capacitors (e.g., sampling/load capacitors) of the stage 202-(*i*+1) are fully discharged before the preceding amplifier 204-*i* starts the integration.

Figure 5:
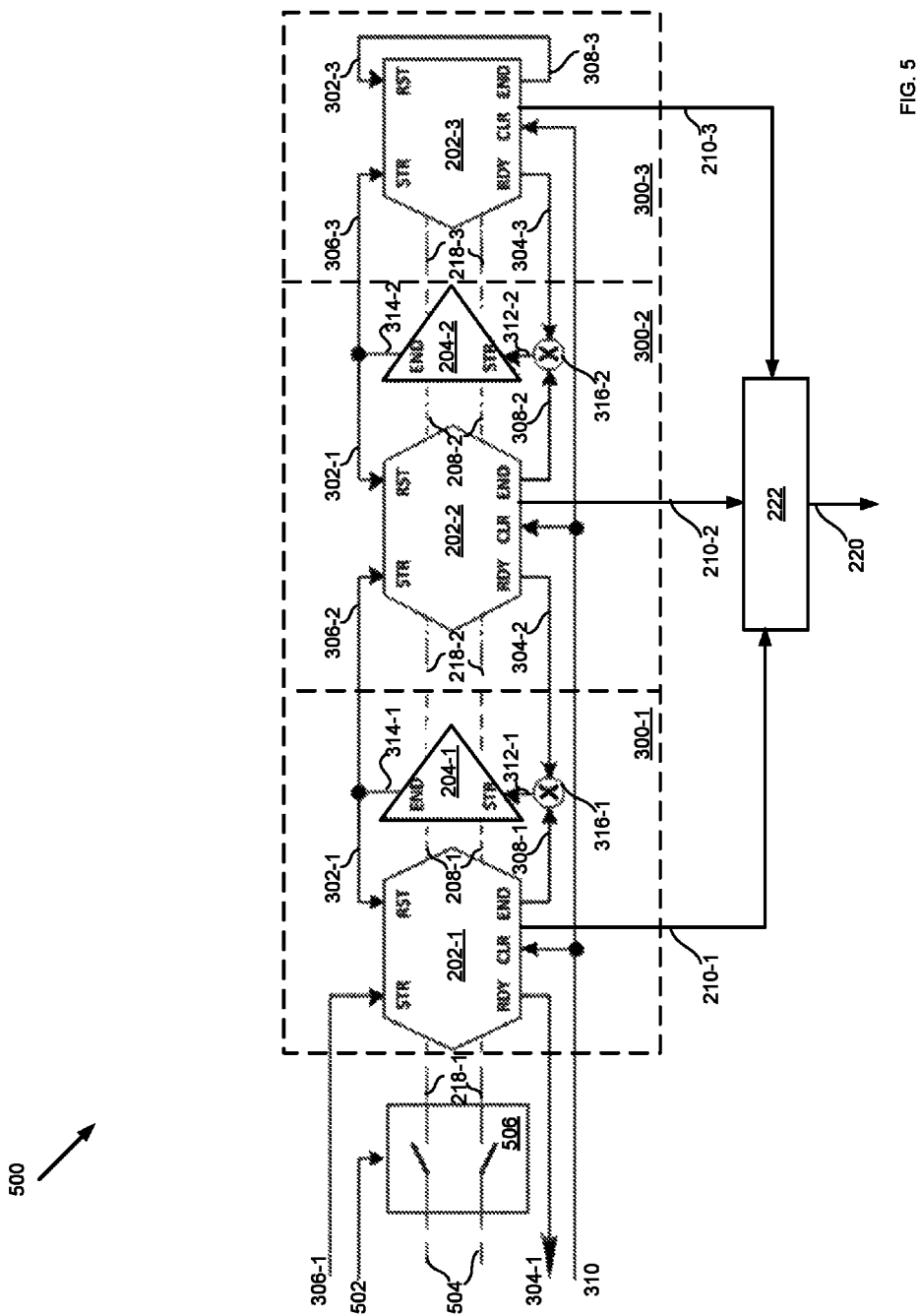
FIG. 5 is a block diagram illustrating a pipeline ADC implemented by cascading blocks 300 of FIG. 3 according to some embodiments of the present disclosure.

Referring to FIG. 5, the modular handshaking scheme described in FIGS. 3 and 4 allows a pipeline ADC 500 to be implemented by cascading a plurality of blocks 300-1, 300-2, and 300-3. Each of the blocks 300-1 are 300-2 is substantially similar to the block 300 of FIG. 3. The last block 300-3 of the pipeline ADC 500 includes a stage 202-3 but does not include an amplifier following the stage 202-3.

In some embodiments, the pipeline ADC 500 includes a sampling circuit 506 (e.g., a sampling switch). The sampling circuit 506 may receive an analog input signal 504, and generate a sampled analog signal 218-1 by sampling the analog input signal 504 in response to a sampling clock signal 502. The sampled analog signal 218-1 is then sent to a sampled analog signal input of the first stage 202-1.

As shown in FIG. 5, the last block 300-3 of the pipeline ADC may not include an amplifier coupled to the stage 202-3. Instead, the stage end signal 308-3 of the stage 202-3 is sent to a reset terminal of the stage 202-3 as the stage reset signal 302-3.

In some embodiments, the sampling clock signal 502 is generated based on a stage ready signal 304-1 provided by the first stage 202-1. As described in detail below, in some embodiments, a timing controller may generate the sampling clock signal 502 based on a stage ready signal 304-1 and a reference clock signal 401.

In some embodiments, the timing controller may generate the stage start signal 306-1 based on the stage ready signal 304-1, and then send the stage start signal 306-1 to the stage start terminal of the first stage 202-1.

In some embodiments, the timing controller may generate a clear signal 310, which is sent to clear terminals of the stages 202-1, 202-2, and 202-3 of the pipeline ADC 500. The stages 202-1, 202-2, and 202-3 may perform a clear process in response to the clear signal 310.

Figure 6:
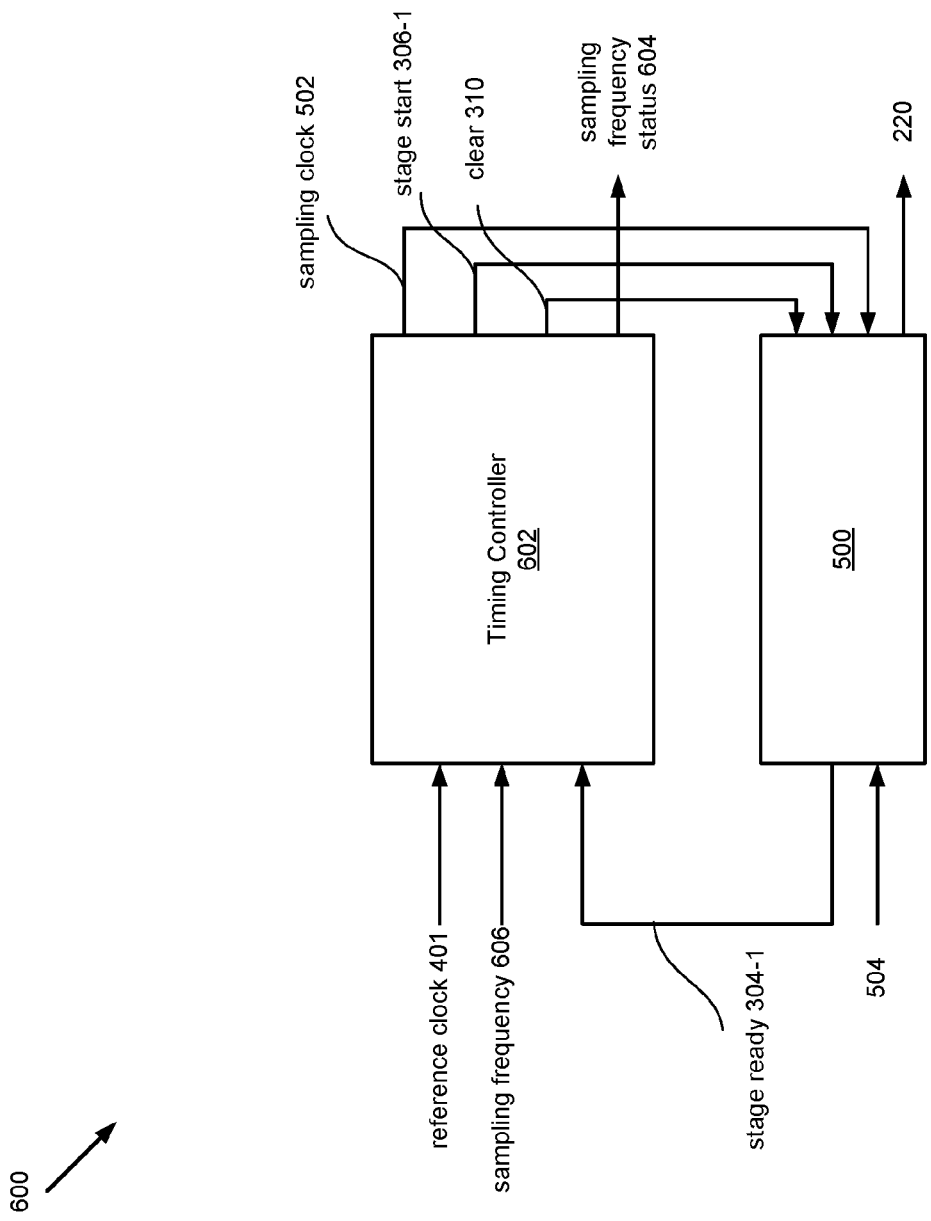
FIG. 6 is a block diagram illustrating a timing controller for controlling a pipeline ADC according to some embodiments of the present disclosure.

Referring to FIG. 6, an exemplary ADC system 600 is illustrated. The ADC system 600 may include a timing controller 602 and a pipeline ADC 500 of FIG. 5, where the timing controller 602 is used to control the timing of the pipeline ADC 500. In the example of FIG. 6, the timing controller 602 receives a reference clock signal 401. In an example, the reference clock signal 401 is synchronized with the analog input signal 504. The timing controller 602 also receives a stage ready signal 304-1 from the first stage 202-1 of the pipeline ADC 500, which indicates that the pipeline of the ADC 500 is ready to process the next sample. The timing controller 602 may generate flag signals (e.g., a clear signal 310 and a sampling frequency status signal 604) based on the timing behavior of the reference clock signal 401 and the stage ready signal 304-1.

In some embodiments, the timing controller 602 may generate a sampling clock signal 502 based on the timing behavior of the reference clock signal 401 and the stage ready signal 304-1. The sampling clock signal 502 may be sent to a sampling circuit 506 of the pipeline ADC 500 for controlling the sampling of the analog input signal 504.

Figure 7:
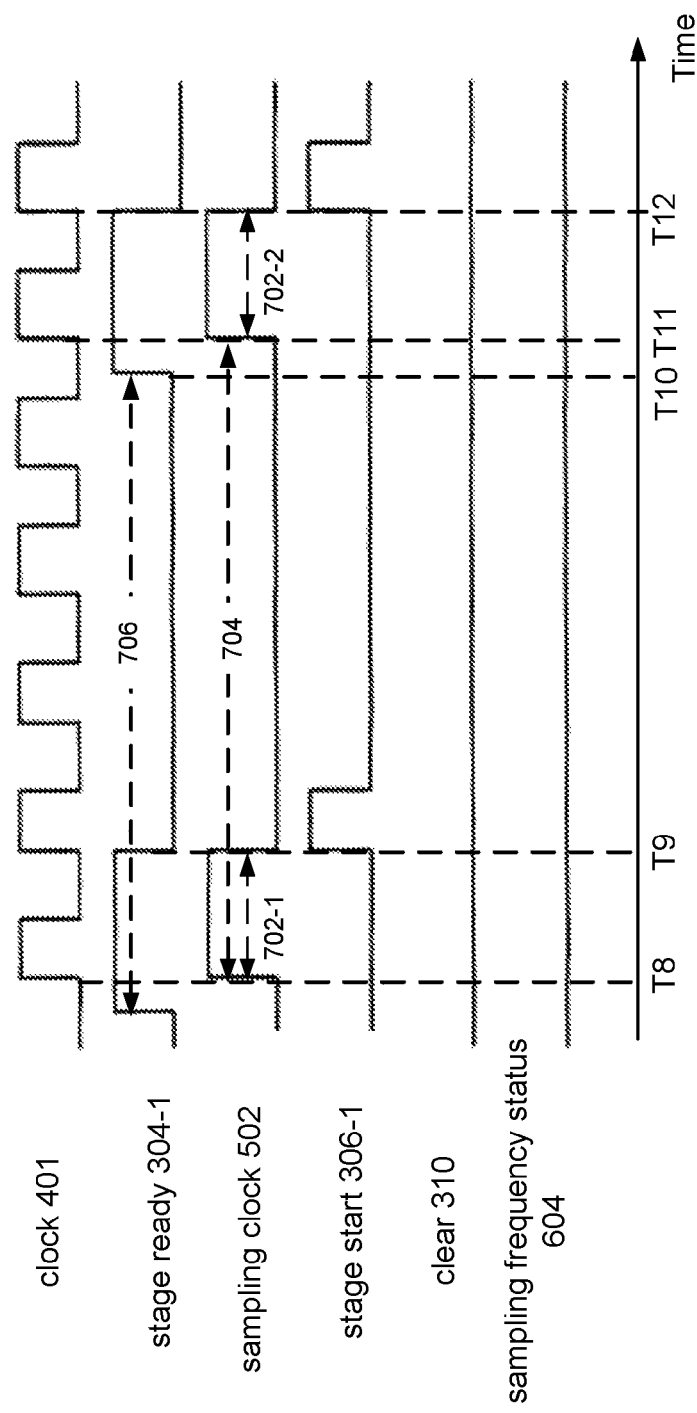
FIG. 7 illustrates waveforms of a pipeline ADC that operates in a normal condition according to some embodiments of the present disclosure.
Figure 8:
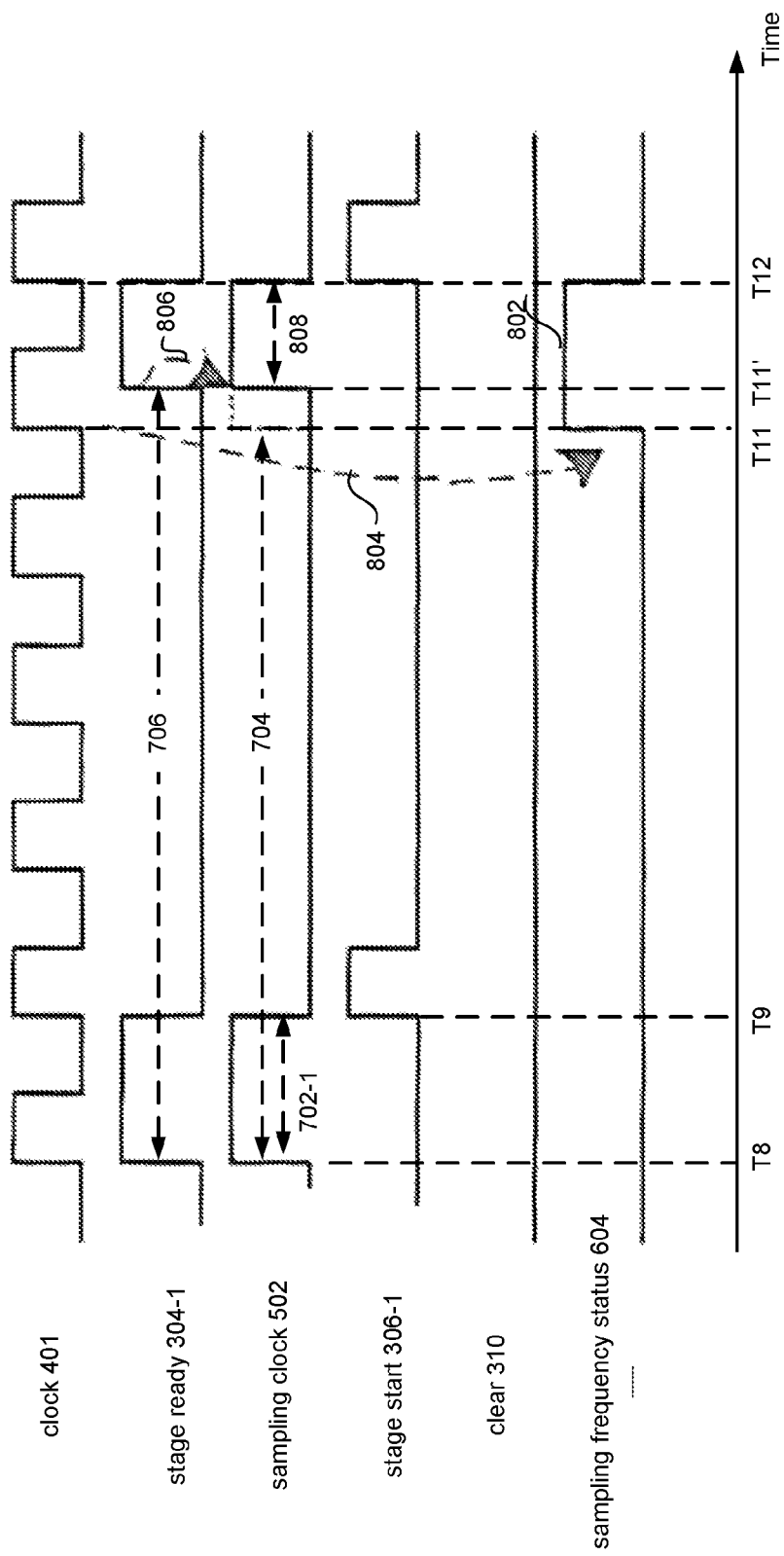
FIG. 8 illustrates waveforms of a pipeline ADC where the sampling frequency exceeds a maximum sampling frequency of the pipeline ADC according to some embodiments of the present disclosure.
Figure 9:
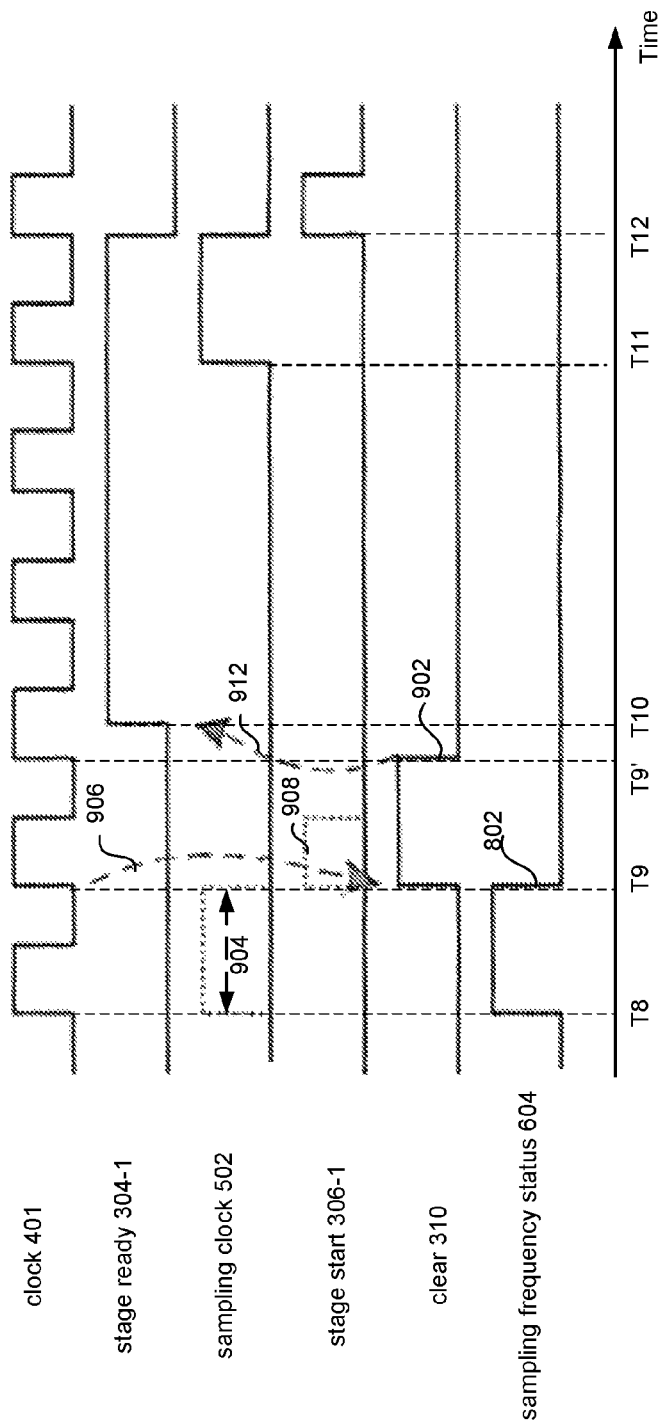
FIG. 9 illustrates waveforms of a pipeline ADC that misses a sample according to some embodiments of the present disclosure.

FIGS. 7, 8, and 9 include waveforms of an ADC system 600 of FIG. 6 operating under various conditions. FIG. 7 illustrates waveforms of an ADC system 600 operating under a normal condition. FIG. 8 illustrates waveforms of an ADC system 600 where the sampling frequency exceeds a maximum sampling frequency. FIG. 9 illustrates waveforms of an ADC system 600 where the sampling frequency exceeds a maximum sampling frequency and the ADC 500 misses a sample.

Referring to FIG. 7, illustrated therein are waveforms of an ADC system 600 operating under a normal condition. While operating under such a normal condition, the flag signals 310 and 604 remain low, and do not include any sampling frequency flag indicating that the sampling frequency is exceeding a predefined maximum sampling frequency or any missed sample flag indicating that the sampled analog signal 218-1 has missed a sample.

In some embodiments, the timing controller 602 generates the sampling clock signal 502 based on the reference clock signal 401 and the stage ready signal 304-1. In the example of FIG. 7, at time T8, at a rising edge of the reference clock signal 401 after the stage ready signal 304-1 is set to high, the timing controller 602 sets a sampling clock signal 502 to high for a sampling period 702-1. Such a sampling period 702-1 in the sampling clock signal 502 may trigger the sampling circuit 506 to sample the analog input signal 504 to generate a first sample in the sampled analog signal 218-1. The sampling clock signal 502 may remain high for a sampling period 702-1. In an example, the sampling period 702-1 is the same as a clock period of the reference clock signal 401.

In the example of FIG. 7, at time T9, the next rising edge of the reference clock signal 401, the stage start signal 306-1 is set to high. This triggers the stage 202-1 to perform operations to process the first sample. At time T9, the stage 202-1 pulls the stage ready signal 304-1 low as the stage 202-1 begins to process that first sample.

Between times T9 and T10, the amplifier 204-1 completes the amplification process for the residue voltage signal 208-1, and the stage 202-1 completes a resetting process triggered by an amplifier end signal 314-1. At time T10, the stage 202-1 pulls the stage ready signal 304-1 to high, indicating that the stage 202-1 is ready to process a second sample following the first sample. At time T11, the timing controller 602 may determine that a period 704 between times T8 and T11 correspond to a sampling frequency associated with the analog input signal 504, and generate a sampling period 702-2 in the sampling clock signal 502. In the example of FIG. 7, the sampling frequency is about ⅕ of the frequency of the reference clock signal 401. In response to the sampling period 702-2 in the sampling clock signal 502, the sampling circuit 506 generates a second sample, and the stage 202-1 begins to process the second sample at time T12 in response to a stage start signal 306-1.

As shown in FIG. 7, it may take a period 706 for the stage 202-1 to get ready between two adjacent samples. Such a period 706 may correspond to a maximum sampling frequency of the ADC system 600. When the ADC system 600 operates under normal conditions, the sampling frequency is equal to or lower than the maximum sampling frequency. In other words, when the ADC system 600 operates under normal conditions, the period 706 corresponding to the maximum sampling frequency is equal to or less than the period 704 corresponding to the sampling frequency. As shown in FIG. 7, when the ADC system 600 operates under normal conditions, the clear signal 310 and the sampling frequency status signal 604 remain at a low voltage level without generating any status flags.

Referring to FIG. 8, illustrated therein are waveforms of an ADC system 600 where the sampling frequency exceeds the maximum sampling frequency of the ADC system 600. As shown in FIG. 8, in response to detecting that the sampling frequency exceeds a maximum sampling frequency, the timing controller 602 generates a sampling frequency status signal 604 including a sampling frequency flag 802.

As shown in FIG. 8, at times T8 and T9, the ADC system 600 processes a first sample substantially similar to processing the first sample as described above with reference to FIG. 7. At time T11, the timing controller 602 determines that a period 704 between times T8 and T11 correspond to a sampling frequency (e.g., ⅕ of the frequency of the reference clock signal 401). However, in FIG. 8, the period 706 is greater than the period 704. In other words, the sampling frequency corresponding to the period exceeds the maximum sampling frequency corresponds to the period 706. As such, at time T11, the stage ready signal 304-1 is at a low voltage level, indicating that the stage 202-1 is not ready to process the next sample. At time T11, as shown by arrow 804, the timing controller 602 keeps the sampling clock signal 502 at a low voltage level, but generates a sampling frequency flag 802 by pulling the sampling frequency status signal 604 to high. Such a sampling frequency flag 802 indicates that the sampling frequency is higher than a maximum sampling frequency of the ADC system 600.

At time T11', the stage ready signal 304-1 is pulled to high. As indicated by the arrow 806, in response to the stage ready signal 304-1, the timing controller 602 sets the sampling clock signal 502 to high at T11', which triggers the sampling circuit 506 to sample the analog input signal 504 and generate a second sample. At time T12, at the first rising edge of the reference clock signal 401 after T11', the timing controller 602 set the sampling clock signal 502 to low. As such, the sampling clock signal 502 remains at high for a sampling period 808 between times T11' and T12. As shown in FIG. 8, the sampling period 808 is less than the sampling period 702-1.

In the example of FIG. 8, while the sampling frequency exceeds the maximum sampling frequency of the ADC system 600, the ADC system 600 still processes both the first sample and the second sample. In some embodiments, as shown in FIG. 9, the ADC system 600 may miss a sample, and the sampling frequency exceeds the maximum sampling frequency of the ADC system 600. In the example of FIG. 9, the timing controller 602 generates a clear signal 310 including a missed sample flag 902. The timing controller 602 also generates a sampling frequency status signal 604 including a sampling frequency flag 802.

As discussed above with reference to FIG. 7, in some examples where that the ADC system 600 operates under normal conditions, the timing controller 602 will set the sampling clock signal 502 to high for an interval 904 between times T8 and T9. In those examples, in response to the sampling clock signal 502, the sampling circuit 506 samples the analog input signal 504 to generate a first sample in the sampled analog signal 218-1. However, as shown in the example of FIG. 9, during the entire interval 904, the stage ready signal 304-1 is at low. In such an example, during the interval 904, the timing controller 602 keeps the sampling clock signal 502 low. As such, the sampling circuit 506 may not sample the analog input signal 504 to generate a corresponding sample during interval 904.

In some embodiments, the timing controller 602 may also generate a sampling frequency flag 802 during the interval 904 substantially similar to the generation of the sampling frequency flag 802 as discussed above with reference to FIG. 8.

As discussed above with reference to FIG. 7, in some embodiments where that the ADC system 600 operates under normal conditions, at time T9, the timing controller 602 will pull the stage start signal 306-1 to high, and in response, the stage 202-1 begins to process the first example. In those embodiments, the stage start signal 306-1 may remain high during the period 908. However, in the example of FIG. 9, because the sampling clock signal 502 remains low during the interval 904, the timing controller 602 keeps the stage start signal 306-1 low during the period 908. As such, the stage 202-1 is not triggered to process the first sample, and the first sample is missed by the ADC system 600. As illustrated by the arrow 906, at time T9, the timing controller 602 determines that the ADC system 600 misses a first sample based on the state of the reference clock signal 401 (e.g., at a rising edge) and the state of the stage ready signal 304-1 (e.g., at a low level). In response to that determination, the timing controller 602 generates a missed sample flag 902 by pulling the clear signal 310 high. In some embodiments, the missed sample flag 902 has a duration that is the same has the period of the reference clock signal 401. In those embodiments, the clear signal 310 is pulled low at time T9'.

In some embodiments, the clear signal 310 is sent to a clear terminal of each of the stages 202-1, 202-2, and 202-3 of the ADC system 600. In response to receiving the missed sample flag 902 in the clear signal 310, each of the stages 202-1, 202-2, and 202-3 of the ADC system 600 may perform a clear process. In some examples, the clear process is substantially similar to a reset process performed in each stage of the ADC system 600. Such a clear process may include resetting capacitors (e.g., loading/sampling capacitors) of each stage of the ADC system 600. After the stage 202-1 determines that the clear process has completed (e.g., sampling/loading capacitors of each stage are fully discharged by the clear process), the stage ready signal 304-1 is pulled high at time T10.

As such, by providing the clear signal 310 including the missed sample flag 902 to each of the stages of the ADC system 600, lock conditions in the ADC system 600 (e.g., a stage ready signal 304-1 remains low) may be removed. As shown by the arrow 912 of FIG. 9, at time T10, after completing the clear operations triggered by the missed sample flag 902, the stage 202-1 pulls the stage ready signal 304-1 high, indicating that the ADC system 600 including its stages is ready to process the next sample. As shown by FIG. 9, at times T11 and T12, the ADC system 600 operates under normal conditions, and a second sample following the first sample is processed by the ADC system 600. For example, at time T11, the timing controller 602 generates a sampling period in the sampling clock signal 502, which triggers the sampling circuit 506 to sample the analog input signal 504 and generate a second sample in the sampled analog voltage signal 218-1.

Figure 10:
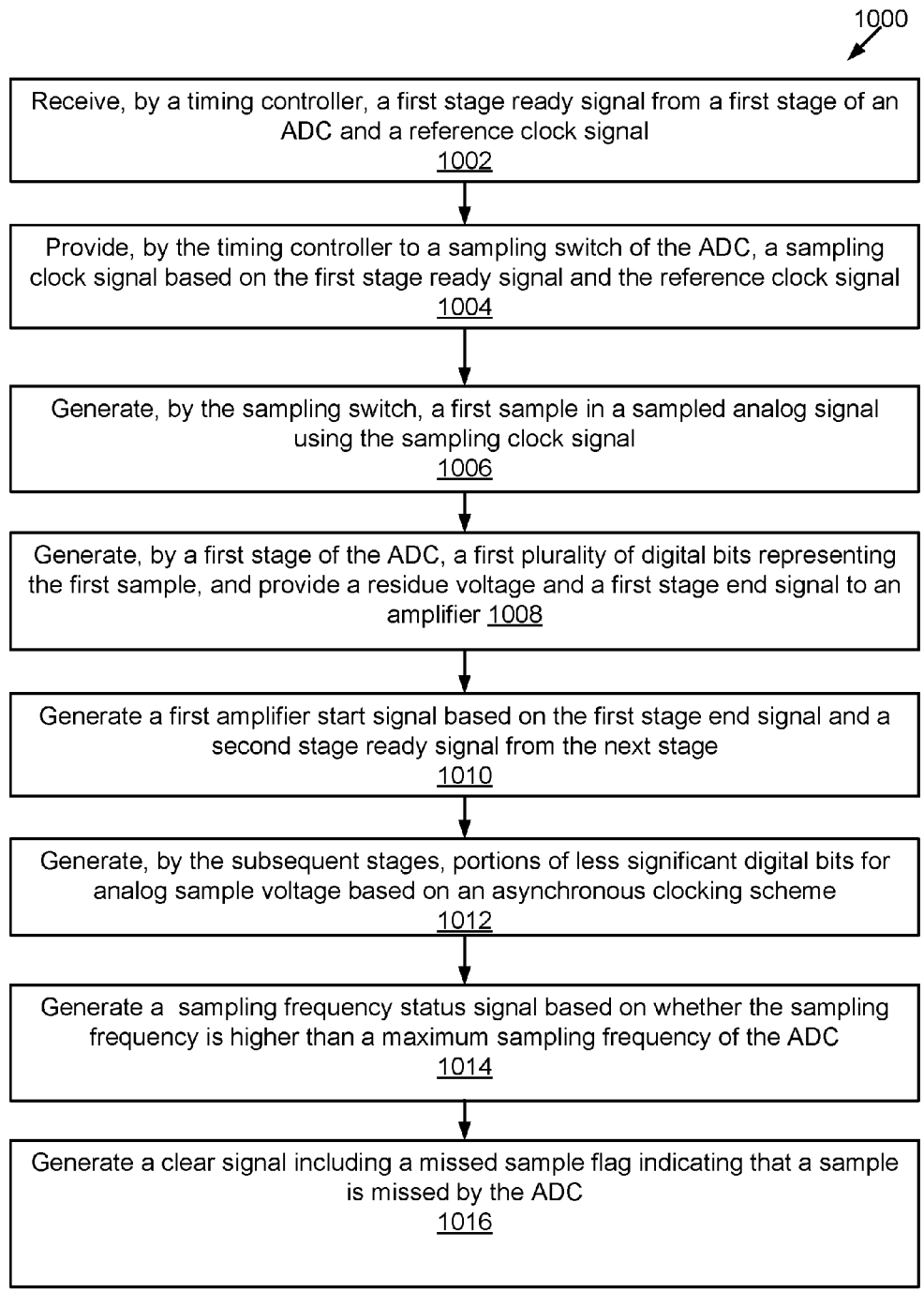
FIG. 10 is a flow diagram illustrating an exemplary method for performing a pipelined analog to digital conversion according to some embodiments of the present disclosure.

Referring to FIG. 10, illustrated therein is a method 1000 for analog to digital conversion. The method 1000 begins at block 1002, where a timing controller 602 receives a stage ready signal 304-1 from a first stage 202-1 of an ADC. The stage ready signal 304-1 may indicate whether the first stage 202-1 of a pipeline ADC is ready to process the next sample. The timing controller 602 may also receive a reference clock signal 401 and a sampling frequency 606.

The method 1000 then proceeds to block 1004, where the timing controller provides a sampling clock signal to the pipeline ADC. As illustrated in FIG. 7, in some embodiments, at block 1004, the timing controller 602 generates a sampling clock signal 502 based on the stage ready signal 304-1 and the reference clock signal 401. For example, the timing controller 602 determines that the first stage 202-1 of a pipeline ADC 500 is ready to process the next sample based on the stage ready signal 304-1. In response to that determination, at a rising edge T8 of the reference clock signal 401, the timing controller 602 generates a sampling period 702-1 in the sampling clock signal 502.

The method 1000 may then proceed to block 1006, where a sampling switch of the ADC generates a sampled analog signal based on the sampling clock signal. As illustrated in FIG. 5, in some embodiments, at block 1006, the sampling circuit 506 of the pipeline ADC 500 performs sampling of the analog input signal 504 based on the sampling clock signal 502, and generates a sampled analog signal 218-1. The sampled analog signal 218-1 may then be sent to a first stage 202-1 of the ADC.

The method 1000 may then proceed to block 1008, where a first stage of the ADC generates a first plurality of digital bits representing a particular analog sample voltage in the sampled analog signal 218-1. In the example of FIG. 5, a first stage 202-1 of an ADC 500 generates a first plurality of digital bits (e.g., the most significant bits B<14:10>) presenting that particular analog sample voltage. At block 1008, after generating the first plurality of digital bits, the first stage 202-1 may generate a residue voltage and provide the residue voltage signal 208-1 including that residue voltage to a first amplifier 204-1. The first stage 202-1 may also provide a first stage end signal 308-1 indicating that the first stage 202-1 has completed processing that particular analog sample voltage.

The method 1000 may then proceed to block 1010, where a first amplifier start signal is generated based on the first stage end signal and a second stage ready signal from the second stage following the first stage. In the example of FIG. 5, an amplifier start signal 312-1 is generated based on the first stage end signal 308-1 and a second stage ready signal 304-2 from the second stage 202-2. By using the amplifier start signal 312-1 to control the amplification process of the amplifier 204-1, it is ensured that the amplifier 204-1 begins integration after the second stage 202-2 is ready (e.g., after capacitors of the second stage 202-2 have been fully discharged).

The method 1000 may then proceed to block 1012, where subsequent blocks following the first block are used to generate portions of less significant digital bits for the analog sample voltage based on an asynchronous clocking scheme. In the example of FIG. 5, block 300-2 includes a stage 202-2 and an amplifier 204-2. In an example, block 300-2 generates a second plurality of digital bits in the digital signal 210-2 (e.g., B<9:5>) for the analog sample voltage. The amplifier 204-2 is controlled by an amplifier start signal 312-2 generated based on a stage end signal 308-2 from the second stage 202-2 and a stage read signal 304-3 from the third stage 202-3. As such, the amplifier 204-2 begins integration after the third stage 202-3 is ready (e.g., after capacitors of the third stage 202-3 have been fully discharged). Similarly, the amplifier 204-2 provides an amplified residue voltage signal 218-3 to block 300-3. The block 300-3 may then generate a third plurality of digital bits in the digital signal 210-3 (e.g., B<4:0>) for the analog sample voltage. In the example of FIG. 5, because it is the last block of the ADC 500, block 300-3 includes a stage 202-3 that sends its stage end signal 308-3 to its reset terminal for controlling a reset process of the stage 202-3. At block 1012, the digital signals 210-1, 210-2, and 210-3 may be combined to generate a digital output signal 220 (e.g., B<14:0>).

The method 1000 may proceed to block 1014, where a sampling frequency status signal is generated based on whether the sampling frequency is higher than a maximum sampling frequency of the ADC. As shown in the examples of FIGS. 6 through 8, the timing controller 602 may generate a sampling frequency status signal 604 based on whether the sampling frequency is higher than a maximum sampling frequency of the ADC. In the example of FIG. 7, the sampling frequency status signal 604 does not include any sampling frequency flag. Such a sampling frequency status signal 604 indicates that the sampling frequency does not exceed a maximum sampling frequency of the ADC. Alternatively, in the example of FIG. 8, the sampling frequency status signal 604 includes a sampling frequency flag 802. Such a sampling frequency flag 802 indicates that the sampling frequency is exceeding the maximum sampling frequency of the ADC.

The method 1000 may proceed to block 1016, where a clear signal is generated based on whether the ADC has missed a sample. As shown in the examples of FIGS. 6 through 9, the timing controller 602 may generate a clear signal 310 based on whether the ADC has missed a sample. In the examples of FIGS. 7 and 8, the clear signal 310 does not include any missed sample flag. Such a clear signal 310 indicates that the ADC has not missed any samples. Alternatively, in the example of FIG. 9, the clear signal 310 includes a missed sample flag 902. Such a missed sample flag 902 indicates that the ADC has missed a sample.

It is noted that various configurations (e.g., the number of blocks in a pipeline ADC 500, the number of digital bits generated by each stage, the type of amplifiers) illustrated in FIGS. 2 through 10 are exemplary only and not intended to be limiting beyond what is specifically recited in the claims that follow. It will be understood by those skilled in that art in possession of this disclosure that other configurations may be used.

Although particular embodiments have been shown and described, it will be understood that it is not intended to limit the claimed inventions to the preferred embodiments, and it will be obvious to those skilled in the art that various changes and modifications may be made without department from the spirit and scope of the claimed inventions. The specification and drawings are, accordingly, to be regarded in an illustrative rather than restrictive sense. The claimed inventions are intended to cover alternatives, modifications, and equivalents.

What is claimed is:

1. An analog to digital converter (ADC) circuit, comprising:
a first stage configured to:
receive a first analog voltage signal;
convert the first analog voltage signal to a first digital signal including a first portion of a digital output signal representing the first analog voltage signal; and
generate a first residue voltage signal based on the first analog voltage signal and the first digital signal;
a first amplifier control unit configured to generate a first amplifier start signal based on a second stage ready signal indicating that a second stage is ready to process a second analog voltage signal;
a first amplifier configured to generate the second analog voltage signal based on the first residue voltage signal in response to the first amplifier start signal;
the second stage configured to:
generate the second stage ready signal;
receive, from the first amplifier, the second analog voltage signal; and
convert the second analog voltage signal to a second digital signal including a second portion of the digital output signal.

2. The ADC circuit of claim 1, wherein the first stage includes:
a first ADC element configured to convert the first analog voltage signal to the first digital signal;
a first digital-to-analog converter (DAC) configured to convert the first digital signal to a reconverted analog voltage signal; and
a residue voltage generator configured to generate the first residue voltage signal corresponding to a difference between the first analog voltage signal and the reconverted analog voltage signal; and
wherein the first amplifier control unit is configured to generate the first amplifier start signal based on a first stage end signal indicating that the first stage completes processing the first analog voltage signal.

3. The ADC circuit of claim 1, further comprising:
a timing controller configured to:
receive a reference clock signal;
receive, from the first stage, a first stage ready signal indicating that the first stage is ready to process the first analog voltage signal; and
generate a sampling clock signal based on the first stage ready signal and the reference clock signal; and
a sampling circuit configured to:
generate the first analog voltage signal by sampling an analog input signal based on the sampling clock signal.

4. The ADC circuit of claim 3, wherein the timing controller is configured to generate a first stage start signal based on the sampling clock signal; and
wherein the first stage is configured to:
receive the first stage start signal; and
in response to the first stage start signal, start to convert the first analog voltage signal to the first digital signal.

5. The ADC circuit of claim 3, wherein the timing controller is configured to:
generate the sampling clock signal based on a first sampling frequency; and
generate a sampling frequency status flag indicating the first sampling frequency exceeds a maximum sampling frequency of the ADC circuit.

6. The ADC circuit of claim 3, wherein the timing controller is configured to:
generate a missed sample flag indicating that the ADC circuit misses a first sample of the analog input signal based on the sampling clock signal and the first stage ready signal.

7. The ADC circuit of claim 1, wherein the first amplifier is configured to:
provide a first amplifier end signal indicating that the first amplifier completes generating the second analog voltage signal;
wherein the first stage is configured to reset a plurality of components of the first stage in response to the first amplifier end signal; and
wherein the second stage is configured to start to convert the second analog voltage signal to the second digital signal in response to the first amplifier end signal.

8. The ADC circuit of claim 1, wherein the second stage is configured to:
generate a second stage end signal indicating that the second stage completes processing the second analog voltage signal; and
in response to the second stage end signal, reset a plurality of components of the second stage.

9. The ADC circuit of claim 1, further comprising:
a second amplifier configured to:
receive, from the second stage, a second residue voltage signal based on the second analog voltage signal and the second digital signal;
receive, from a third stage, a third stage ready signal indicating that the second stage is ready to process a third analog voltage signal; and
in response to the third stage ready signal, generate the third analog voltage signal based on the second residue voltage signal; and
the third stage configured to:
generate the third stage ready signal;
receive, from the second amplifier, the third analog voltage signal; and
convert the third analog voltage signal to a third digital signal including a third portion of the digital output signal.

10. The ADC circuit of claim 1, wherein the first amplifier is an open loop integrating amplifier.

11. A method, including:
receiving, by a first stage, a first analog voltage signal;
converting, by the first stage, the first analog voltage signal to a first digital signal including a first portion of a digital output signal representing the first analog voltage signal;
generating, by the first stage, a first residue voltage signal based on the first analog voltage signal and the first digital signal;
generating, by a second stage, a second stage ready signal indicating that the second stage is ready to process a second analog voltage signal;
generating, by a first amplifier control unit, a first amplifier start signal based on the second stage ready signal;
generating, by a first amplifier, the second analog voltage signal based on the first residue voltage signal in response to the first amplifier start signal; and
converting, by the second stage, the second analog voltage signal to a second digital signal including a second portion of the digital output signal.

12. The method of claim 11, wherein the generating the first residue voltage signal includes:
converting the first digital signal to a reconverted analog voltage signal; and
generating the first residue voltage signal corresponding to a difference between the first analog voltage signal and the reconverted analog voltage signal; and
wherein the generating the first amplifier start signal includes:
generating, by the first amplifier control unit, the first amplifier start signal based on a first stage end signal indicating that the first stage completes processing the first analog voltage signal.

13. The method of claim 11, further comprising:
receiving a reference clock signal;
receiving, from the first stage, a first stage ready signal indicating that the first stage is ready to process the first analog voltage signal;
generating a sampling clock signal based on the first stage ready signal and the reference clock signal; and
generating the first analog voltage signal by sampling an analog input signal based on the sampling clock signal.

14. The method of claim 13, further comprising:
generating a first stage start signal based on the sampling clock signal;
receiving, by the first stage, the first stage start signal; and
in response to the first stage start signal, starting, by the first stage, to convert the first analog voltage signal to the first digital signal.

15. The method of claim 13, further comprising:
generating the sampling clock signal based on a first sampling frequency; and
generating a sampling frequency status flag indicating that the first sampling frequency exceeds a predefined maximum sampling frequency.

16. The method of claim 13, further comprising:
generating a missed sample flag indicating that the first analog voltage signal misses a first sample associated with the analog input signal based on the sampling clock signal and the first stage ready signal.

17. The method of claim 11, further comprising:
providing, by the first amplifier, a first amplifier end signal indicating that the first amplifier completes generating the second analog voltage signal;
in response to the first amplifier end signal, resetting, by the first stage, a plurality of components of the first stage; and
in response to the first amplifier end signal, starting, by the second stage to convert the second analog voltage signal to the second digital signal.

18. The method of claim 11, further comprising:
generating, by the second stage, a second stage end signal indicating that the second stage completes processing the second analog voltage signal; and
in response to the second stage end signal, reset, by the second stage, a plurality of components of the second stage.

19. The method of claim 11, further comprising:
receiving, by a second amplifier from the second stage, a second residue voltage signal based on the second analog voltage signal and the second digital signal;
generating, by a third stage, a third stage ready signal;
receiving, by the second amplifier from the third stage, the third stage ready signal indicating that the second stage is ready to process a third analog voltage signal;
in response to the third stage ready signal, generating, by the second amplifier, the third analog voltage signal based on the second residue voltage signal; and converting, by the third stage, the third analog voltage signal to a third digital signal including a third portion of the digital output signal.

20. The method of claim 11, further comprising:

receiving, from the first stage, a first stage end signal indicating that the first stage completes processing the first analog voltage signal; and generating the first amplifier start signal based on the second stage ready signal and the first stage end signal.

* * * * *